United States Patent
Kirkpatrick

(10) Patent No.: US 12,421,597 B2
(45) Date of Patent: Sep. 23, 2025

(54) SEAL PLATES FOR CHEMICAL VAPOR INFILTRATION AND DEPOSITION CHAMBERS

(71) Applicant: GOODRICH CORPORATION, Charlotte, NC (US)

(72) Inventor: Christopher T. Kirkpatrick, Pueblo West, CO (US)

(73) Assignee: GOODRICH CORPORATION, Charlotte, NC (US)

( * ) Notice: Subject to any disclaimer, the term of this patent is extended or adjusted under 35 U.S.C. 154(b) by 79 days.

(21) Appl. No.: 18/461,918

(22) Filed: Sep. 6, 2023

(65) Prior Publication Data
US 2023/0407463 A1    Dec. 21, 2023

Related U.S. Application Data

(62) Division of application No. 16/819,545, filed on Mar. 16, 2020, now Pat. No. 11,788,186.

(51) Int. Cl.
*C23C 16/04* (2006.01)
*C23C 16/26* (2006.01)
*F16D 65/12* (2006.01)

(52) U.S. Cl.
CPC .......... *C23C 16/045* (2013.01); *C23C 16/042* (2013.01); *C23C 16/26* (2013.01); *F16D 65/126* (2013.01)

(58) Field of Classification Search
CPC ..... C23C 16/045; C23C 16/042; C23C 16/26; C23C 16/30; C23C 16/45517; C23C 16/45591; C23C 16/4583; F16D 65/126
See application file for complete search history.

(56) References Cited

U.S. PATENT DOCUMENTS

| | | | |
|---|---|---|---|
| 9,834,842 B2 | 12/2017 | Kirkpatrick et al. |
| 9,845,534 B2 | 12/2017 | Delperier et al. |
| 10,508,334 B2 | 12/2019 | Kirkpatrick |
| 2004/0175564 A1 | 9/2004 | Chang |

(Continued)

FOREIGN PATENT DOCUMENTS

CN    107829078    6/2019

OTHER PUBLICATIONS

European Patent Office, European Search Report dated Aug. 3, 2021 in Application No. 21162589.2.

(Continued)

*Primary Examiner* — Alexander M Weddle
(74) *Attorney, Agent, or Firm* — SNELL & WILMER L.L.P.

(57) ABSTRACT

A seal plate disposable between a pair of preforms for chemical vapor infiltration is disclosed. The seal plate may include a plurality of first channels that extend completely through the seal plate and that are located between an inner annulus and outer annulus of the seal plate. The seal plate may further include a plurality of second channels that also extend completely through the seal plate and that are located also between an inner annulus and outer annulus. The first channels may differ from the second channels in at least one respect (e.g., the first channels may be of a different width than the second channels). The first channels may provide an inlet for the chemical vapor infiltration of the preform, while the second channels may provide an outlet for the chemical vapor infiltration of the preform.

6 Claims, 6 Drawing Sheets

(56) References Cited

U.S. PATENT DOCUMENTS

| | | |
|---|---|---|
| 2006/0194059 A1 | 8/2006 | Arico et al. |
| 2011/0097490 A1 | 4/2011 | Kerr et al. |
| 2016/0333470 A1* | 11/2016 | Kirkpatrick .......... F16D 65/126 |
| 2017/0002466 A1 | 1/2017 | Delperier et al. |

OTHER PUBLICATIONS

USPTO; Restriction Requirement dated Aug. 30, 2021 in U.S. Appl. No. 16/819,545.
USPTO; Non-Final Office Action dated Feb. 16, 2022 in U.S. Appl. No. 16/819,545.
USPTO; Final Office Action dated Sep. 14, 2022 in U.S. Appl. No. 16/819,545.
USPTO; Advisory Action dated Nov. 18, 2022 in U.S. Appl. No. 16/819,545.
USPTO; Non-Final Office Action dated Feb. 2, 2023 in U.S. Appl. No. 16/819,545.
USPTO; Notice of Allowance dated Jun. 14, 2023 in U.S. Appl. No. 16/819,545.
European Patent Office, European Office Action dated Nov. 6, 2023 in Application No. 21162589.2.

* cited by examiner

SEAL PLATES FOR CHEMICAL VAPOR INFILTRATION AND DEPOSITION CHAMBERS

CROSS REFERENCE TO RELATED APPLICATIONS

This application is a divisional of U.S. patent application Ser. No. 16/819,545, filed Mar. 16, 2020, entitled "SEAL PLATES FOR CHEMICAL VAPOR INFILTRATION & DEPOSITION CHAMBERS" which is incorporated by reference herein in its entirety for all purposes.

FIELD

The present disclosure generally relates to the field of chemical vapor infiltration and deposition chambers and, more particularly, to spacers disposed between adjacent pairs of preforms in such chambers.

BACKGROUND

Chemical vapor infiltration and deposition (CVI/CVD) is a known process for making composite structures such as carbon/carbon brake disks. The CVI/CVD process typically used for making carbon/carbon brake disks may involve passing a reactant gas or gas mixture (e.g., methane, propane, etc.) around heated porous structures (e.g., carbonized preforms) with a pressure differential driving the gas mixture into the porous structures. The gas enters into the porous structures, driven by pressure gradients, and undergoes a reaction such as thermal decomposition, hydrogen reduction, co-reduction, oxidation, carbonization, or nitridation to deposit a binding matrix.

Depending on CVI/CVD methodology and conditions, the porous structure may not densify at a uniform rate across the thickness of a porous structure, may not form a desired microstructure, and may be associated with long processing times. Thus, creation of uniformly densified porous structures may be impaired using conventional systems and methods.

SUMMARY

The present disclosure encompasses and/or embodies a seal plate for disposition in a chemical vapor infiltration and deposition chamber. The seal plate may include a plurality of channels that extend completely through the seal plate. Such a plurality of channels may include a plurality of first channels, along with a plurality of second channels.

The seal plate may be in the form of a thin structure, with a maximum thickness being about 0.5" (12.7 mm) in various embodiments and about 0.15" (3.81 mm) in various embodiments. Any appropriate material or combination of materials may be utilized for the seal plate, including without limitation Carbon/Carbon (C/C), Silicon Carbide (SiC) or other refractory type materials that can withstand CVD temperatures. A body of the seal plate may include a plurality of fibers, such as carbon fibers, fiber-reinforced silicon carbide (SiC), Grafoil® (UCAR graphite based material), or any combination thereof. The seal plate may be densified by CVI/CVD.

The seal plate may have an opening (e.g., centrally disposed). An inner perimeter of the seal plate may define a boundary of this opening, and an outer perimeter may be spaced (e.g., outwardly) from this inner perimeter. Such an inner perimeter and outer perimeter for the seal plate may be concentrically disposed, such that the outer perimeter may be characterized as being disposed radially outwardly from the inner perimeter.

A plurality of first channels may extend through the seal plate. What may be characterized as a first end of these first channels may be spaced outwardly from the above-noted inner perimeter of the seal plate, while what may be characterized as a second end of these first channels may be spaced inwardly from the above-noted outer perimeter of the seal plate, with the first end of each of the first channels being positioned closer to the inner perimeter than their corresponding second end. The first end of each of the first channels may be disposed a common distance from the inner perimeter, the second end of each of the first channels may be disposed a common distance from the outer perimeter, or both. Various embodiments has/have the width of each first channel progressively increasing proceeding from its corresponding first end to its corresponding second end (e.g., increasing at a constant rate). Each first channel may have a minimum width, proceeding along its corresponding length dimension, of about 0.25" (6.35 mm) in various embodiments. A centerline of each of the plurality of first channels (e.g., that extends from a first end to a corresponding second end of a given first channel) may be disposed along a radius extending from a center of the seal plate.

A plurality of second channels may extend through the seal plate. What may be characterized as a first end of these second channels may be spaced outwardly from the above-noted inner perimeter of the seal plate, while what may be characterized as a second end of these second channels may be spaced inwardly from the above-noted outer perimeter of the seal plate, with the first end of each of the second channels being positioned closer to the inner perimeter than their corresponding second end. The first end of each of the second channels may be disposed a common distance from the inner perimeter, the second end of each of the second channels may be disposed a common distance from the outer perimeter, or both. Various embodiments has/have the width of each second channel progressively increasing proceeding from its corresponding first end to its corresponding second end (e.g., increasing at a constant rate). Each second channel may have a minimum width, proceeding along its corresponding length dimension, of about 0.25" (6.35 mm) in various embodiments. A centerline of each of the plurality of second channels (e.g., that extends from a first end to a corresponding second end of a given second channel) may be disposed along a radius extending from a center of the seal plate.

At least one second channel may be disposed between each adjacent pair of first channels. Various embodiments has/have a single second channel being disposed between each adjacent pair of first channels. The plurality of first channels may be characterized as being offset in a radial dimension relative to each of the plurality of second channels.

The first end of each first channel may be disposed closer to the inner perimeter of the seal plate than the first end of each second channel. The second end of each second channel may be disposed closer to the outer perimeter of the seal plate than the second end of each first channel. The width of the first end of each first channel may be greater than the width of the first end of each second channel. The width of the second end of each first channel may be greater than the width of the second end of each second channel.

The seal plate may include both an inner annulus and an outer annulus. Each channel that extends through the seal plate may extend from the inner annulus to the outer annulus. None of the channels used by the seal plate extend into the inner annulus or the outer annulus in various embodiments (e.g., the inner annulus, the outer annulus, or both may be free of one or more openings, one or more slots that extend partially through the seal plate, and/or may be free of one or more channels or other apertures that extend completely through the seal plate). A minimum width of the inner annulus is about 0.25" (6.35 mm) in various embodiments. A minimum width of the outer annulus is about 0.25" (6.35 mm) in various embodiments.

The seal plate may be characterized as including an upper surface and an oppositely disposed lower surface, the distance between which may be characterized as defining a thickness of the seal plate. One or alignment features may be included on at least one of the upper and lower surfaces of the seal plate, for instance to facilitate positioning a preform thereon. An inner alignment feature may be included on at least one of the upper and lower surfaces of the seal plate (e.g., such that a preform positioned on the seal plate is not disposed inwardly of such an alignment feature). An outer alignment feature may be included on at least one of the upper and lower surfaces of the seal plate (e.g., such that a preform positioned on the seal plate is not disposed outwardly of such an alignment feature). Any such inner alignment feature, any such outer alignment feature, or both may be in the form of a mark, groove, or the like. When both an inner alignment feature and an outer alignment feature are utilized, these alignment features may be concentrically disposed relative to one another, including in relation to an inner perimeter and/or an outer perimeter of the seal plate.

A preform stack for disposition in a chemical vapor infiltration and deposition chamber may include a pair of the above-noted seal plates, with a preform being disposed between and engaged by these seal plates. At least part of each first channel used by these seal plates may extend inwardly beyond an inner perimeter of the preform, and may define an inlet for introducing a gaseous medium into the corresponding first channel. One or more inner alignment features may be utilized to realize such a positioning. At least part of each second channel used by the seal plates may extend outwardly beyond an outer perimeter of the preform, and may define an outlet for allowing a gaseous medium to exit the corresponding second channel. One or more inner alignment features may be utilized to realize such a positioning. A chemical vapor infiltration and deposition chamber may be pressurized such that a gaseous medium enters each first channel through a corresponding and above-described inlet, and such that a gaseous medium exits each second channel through a corresponding and above-described outlet (e.g., a high pressure region in the chemical vapor infiltration and deposition chamber may be disposed radially inward of a low pressure region in the chemical vapor infiltration and deposition chamber, including where such a low pressure region corresponds with/includes the above-described opening in each seal plate within the preform stack).

Various aspects are also addressed by the following paragraphs and in the noted combinations:

1. A seal plate disposable between a pair of preforms in a chemical vapor infiltration and deposition chamber, comprising:
   a body comprising an opening, an inner perimeter that defines a boundary of said opening, an outer perimeter spaced from said inner perimeter, an upper surface, and a lower surface that is spaced from said upper surface to define a thickness of said body;
   a plurality of first channels that extend completely through said thickness of said body, wherein a first end of each first channel of said plurality of first channels is spaced outwardly from said inner perimeter, wherein a second end of each said first channel is spaced inwardly from said outer perimeter, and wherein said first end of each said first channel is positioned closer to said inner perimeter than its corresponding said second end;
   a plurality of second channels that extend completely through said thickness of said body proceeding from said upper surface to said lower surface, wherein a first end of each second channel of said plurality of second channels is spaced outwardly from said inner perimeter, wherein a second end of each said second channel is spaced inwardly from said outer perimeter, and wherein said first end of each said second channel is positioned closer to said inner perimeter than its corresponding said second end;
   wherein each of said plurality of first channels is different from each of said plurality of second channels.

2. The seal plate of paragraph 1, wherein said body comprises a plurality of fibers selected from the group consisting of carbon, silicon carbide, or any combination thereof.

3. The seal plate of any of paragraphs 1-2, wherein said inner perimeter and said outer perimeter are each circular and concentrically disposed.

4. The seal plate of any of paragraphs 1-3, wherein said first end of each said first channel is disposed a common distance from said inner perimeter.

5. The seal plate of any of paragraphs 1-4, wherein said second end of each said first channel is disposed a common distance from said outer perimeter.

6. The seal plate of any of paragraphs 1-5, wherein said first end of each said second channel is disposed a common distance from said inner perimeter.

7. The seal plate of any of paragraphs 1-6, wherein said second end of each said second channel is disposed a common distance from said outer perimeter.

8. The seal plate of any of paragraphs 1-7, wherein a width of each said first channel progressively increases proceeding from its corresponding said first end to its corresponding said second end.

9. The seal plate of any of paragraphs 1-7, wherein said width of each said first channel increases at a constant rate proceeding from its corresponding said first end to its corresponding said second end.

10. The seal plate of any of paragraphs 1-9, wherein a width of each said second channel progressively increases proceeding from its corresponding said first end to its corresponding said second end.

11. The seal plate of any of paragraphs 1-9, said width of each said second channel increases at a constant rate proceeding from its corresponding said first end to its corresponding said second end.

12. The seal plate of any of paragraphs 1-11, wherein said first end of each said first channel is closer to said inner perimeter than said first end of each said second channel.

13. The seal plate of any of paragraphs 1-12, wherein said second end of each said second channel is closer to said outer perimeter than said second end of each said first channel.

14. The seal plate of any of paragraphs 1-13, wherein a width of said first end of each said first channel is greater than a width of said first end of each said second channel.

15. The seal plate of any of paragraphs 1-14, wherein a width of said second end of each said first channel is greater than a width of said second end of each said second channel.

16. The seal plate of any of paragraphs 1-15, wherein said thickness of said body is no more than about 0.5" (12.7 mm).

17. The seal plate of any of paragraphs 1-16, wherein a centerline of each of said plurality of first channels and each of said plurality of second channels are disposed along a separate radius.

18. The seal plate of any of paragraphs 1-17, wherein at least one said second channel is disposed between each adjacent pair of said first channels.

19. The seal plate of any of paragraphs 1-17, wherein one said second channel is disposed between each adjacent pair of said first channels.

20. The seal plate of any of paragraphs 1-19, wherein said body further comprises an inner annulus and an outer annulus, wherein each of said plurality of first channels and each of said plurality of second channels are located entirely between said inner annulus and said outer annulus.

21. The seal plate of paragraph 20, wherein a minimum width of said inner annulus is about 0.25" (6.35 mm).

22. The seal plate of any of paragraphs 20-21, wherein a minimum width of said outer annulus is about 0.25" (6.35 mm).

23. The seal plate of any of paragraphs 1-22, wherein a minimum width of said first end of each said first channel is about 0.25" (6.35 mm).

24. The seal plate of any of paragraphs 1-22, wherein a width of said first end of each said first channel is within a range of about 0.5" (12.7 mm) to about 2" (50.8 mm).

25. The seal plate of any of paragraphs 1-24, further comprising an inner alignment feature on said upper surface and an outer alignment feature on said upper surface.

26. The seal plate of paragraph 25, wherein said inner alignment feature comprises at least one first alignment groove and wherein said outer alignment feature comprises at least one second alignment groove.

27. The seal plate of paragraph 26, wherein each said first alignment groove is disposed outwardly of said first end of each said first channel and intersects a corresponding adjacent pair of said first channels.

28. The seal plate of any of paragraphs 26-27, wherein each said second alignment groove is disposed inwardly of said second end of each said second channel and intersects a corresponding adjacent pair of said second channels.

29. A preform assembly comprising a preform, a first said seal plate of any of paragraphs 25-28, and a second said seal plate of any of paragraphs 25-28, wherein said preform is disposed between and contacts each of said first said seal plate and said second said seal plate, wherein an inner perimeter of said preform is aligned with said inner alignment feature, and wherein an outer perimeter of said preform is aligned with said outer alignment feature.

30. A chemical vapor infiltration and deposition chamber comprising a first said seal plate of any of paragraphs 1-28, a second said seal plate of any of paragraphs 1-28, and a preform disposed between and contacting each of wherein said first said seal plate and said second said seal plate.

31. The chemical vapor infiltration and deposition chamber of paragraph 30, wherein a high pressure side of said chemical vapor infiltration and deposition chamber is associated with said inner perimeter of each of said first said seal plate and said second said seal plate, and wherein a low pressure side of said chemical vapor infiltration and deposition chamber is associated with said outer perimeter of each of said first said seal plate and said second said seal plate.

32. The chemical vapor infiltration and deposition chamber of paragraph 31, wherein said first channels comprise inlets channels and said second channels comprise outlet channels.

33. A preform stack for disposition in a chemical vapor infiltration and deposition chamber, comprising:
  a preform comprising an upper preform surface and a lower preform surface;
  a first seal plate disposed on and contacting said upper preform surface; and a second seal plate disposed on and contacting said lower preform surface, wherein each of said first seal plate and said second seal plate comprises:
    a body comprising an opening, an inner perimeter that defines a boundary of said opening, an outer perimeter spaced from said inner perimeter, an upper surface, and a lower surface that is spaced from said upper surface;
    a plurality of first channels that extend completely through said body from said upper surface to said lower surface, wherein a first end of each first channel of said plurality of first channels is spaced outwardly from said inner perimeter, wherein a second end of each said first channel is spaced inwardly from said outer perimeter, and wherein said first end of each said first channel is positioned closer to said inner perimeter than its corresponding said second end.

34. The preform stack of paragraph 33, wherein said preform comprises a plurality of first fibers.

35. The preform stack of any of paragraphs 33-34, wherein said body comprises a plurality of second fibers.

36. The preform stack of any of paragraphs 33-35, wherein said inner perimeter and said outer perimeter are each circular and concentrically disposed.

37. The preform stack of any of paragraphs 33-36, wherein said first end of each said first channel is disposed a common distance from said inner perimeter.

38. The preform stack of any of paragraphs 33-37, wherein said second end of each said first channel is disposed a common distance from said outer perimeter.

39. The preform stack of any of paragraphs 33-38, wherein a width of each said first channel progressively increases proceeding from its corresponding said first end to its corresponding said second end.

40. The preform stack of any of paragraphs 33-38, a width of each said first channel increases at a constant rate proceeding from its corresponding said first end to its corresponding said second end.

41. The preform stack of any of paragraphs 33-40, wherein a minimum width of said first end of each said first channel is about 0.25" (6.35 mm).

42. The preform stack of any of paragraphs 33-40, wherein a width of said first end of each said first channel is within a range of about 0.5" (12.7 mm) to about 2" (50.8 mm).

43. The preform stack of any of paragraphs 33-42, further comprising an alignment feature on said upper surface.

44. The preform stack of any of paragraphs 33-42, wherein said body further comprises a plurality of second channels that extend completely through said thickness of said body proceeding from said upper surface to said lower surface, wherein a first end of each second channel of said plurality of second channels is spaced outwardly from said inner perimeter, wherein a second end of each said second channel is spaced inwardly from said outer perimeter, and wherein said first end of each said second channel is positioned closer to said inner perimeter than its corresponding said second end.

45. The preform stack of paragraph 44, wherein each of said plurality of first channels is different from each of said plurality of second channels.

46. The preform stack of any of paragraphs 44-45, wherein said first end of each said second channel is disposed a common distance from said inner perimeter.

47. The preform stack of any of paragraphs 44-46, wherein said second end of each said second channel is disposed a common distance from said outer perimeter.

48. The preform stack of any of paragraphs 44-47, wherein a width of each said second channel progressively increases proceeding from its corresponding said first end to its corresponding said second end.

49. The preform stack of any of paragraphs 44-47, wherein said width of each said second channel increases at a constant rate proceeding from its corresponding said first end to its corresponding said second end.

50. The preform stack of any of paragraphs 44-49, wherein said first end of each said first channel is closer to said inner perimeter than said first end of each said second channel.

51. The preform stack of any of paragraphs 44-50, wherein said second end of each said second channel is closer to said outer perimeter than said second end of each said first channel.

52. The preform stack of any of paragraphs 44-51, wherein a width of said first end of each said first channel is greater than a width of said first end of each said second channel.

53. The preform stack of any of paragraphs 44-52, wherein a width of said second end of each said first channel is greater than a width of said second end of each said second channel.

54. The preform stack of any of paragraphs 44-53, wherein a centerline of each of said plurality of first channels and each of said plurality of second channels are disposed along a separate radius.

55. The preform stack of any of paragraphs 44-54, wherein at least one said second channel is disposed between each adjacent pair of said first channels.

56. The preform stack of any of paragraphs 44-55, wherein one said second channel is disposed between each adjacent pair of said first channels.

57. The preform stack of any of paragraphs 44-56, wherein said first channels extend beyond an inner perimeter of said preform and said second channels extend beyond an outer perimeter of said preform.

58. The preform stack of any of paragraphs 44-56, wherein said first end of each said first channel is disposed inwardly of an inner perimeter of said preform and a remainder of each said first channel accesses one of said upper preform surface and said lower preform surface, wherein said second end of each said second channel is disposed outwardly of an outer perimeter of said preform and a remainder of each said second channel accesses one of said upper preform surface and said lower preform surface.

59. The preform stack of any of paragraphs 44-58, wherein said body further comprises an inner annulus and an outer annulus, wherein each of said plurality of first channels and each of said plurality of second channels are located entirely between said inner annulus and said outer annulus.

60. The preform stack of paragraph 59, wherein a minimum width of said inner annulus is about 0.25" (6.35 mm).

61. The preform stack of any of paragraphs 59-60, wherein a minimum width of said outer annulus is about 0.25" (6.35 mm).

62. The preform stack of any of paragraphs 44-61, further comprising an inner alignment feature on said upper surface and an outer alignment feature on said upper surface.

63. The preform stack of paragraph 62, wherein said inner alignment feature comprises at least one first alignment groove and wherein said outer alignment feature comprises at least one second alignment groove.

64. The preform stack of paragraph 63, wherein each said first alignment groove is disposed outwardly of said first end of each said first channel and intersects a corresponding adjacent pair of said first channels.

65. The preform stack of any of paragraphs 63-64, wherein each said second alignment groove is disposed inwardly of said second end of each said second channel and intersects a corresponding adjacent pair of said second channels.

66. The preform stack of any of paragraphs 62-65, wherein an inner perimeter of said preform is aligned with said inner alignment feature and an outer perimeter of said preform is aligned with said outer alignment feature.

67. The preform stack of any of paragraphs 33-66, further comprising:
a second said preform, wherein said first seal plate is disposed between and engages each of said preform and said second said preform, where said preform closes one side of a first length portion of each of said plurality of first channels and said second said preform closes an opposite side of said first length portion of each of said plurality of first channels.

68. The preform stack of any of paragraphs 33-67, wherein said thickness of said body is no more than about 0.5" (12.7 mm).

69. A method of processing a preform, comprising the steps of:
disposing a preform in a chamber between first and second seal plates that engage opposing surfaces of said preform, wherein each of said first and second seal plates comprises a plurality of first channels that each provide an open space that directly interfaces with one of said opposing surfaces of said preform;
directing a gaseous medium into said chamber;
introducing said gaseous medium into each of said plurality of first channels;
increasing a surface area of said preform that is exposed to said gaseous medium within each of said plurality of first channels when proceeding in a first direction along each of said plurality of first channels; and depositing a material within an interior of said preform using said gaseous medium.

70. The method of paragraph 69, wherein said preform comprises an inner perimeter and an outer perimeter, and wherein said first direction is toward said outer perimeter of said preform.

71. The method of paragraph 70, further comprising:
introducing said gaseous medium into an inlet zone of said chamber that is located inwardly of said inner perimeter of said preform.

72. The method of paragraph 71, wherein said first direction is toward an exit zone that is at a lower pressure than said inlet zone and that is located outwardly of said inlet zone.

73. The method of paragraph 72, wherein each of said first and second seal plates comprise an interior opening, an outer perimeter, and an inner perimeter that defines a boundary of said interior opening, wherein said inlet zone comprises said interior opening of each of said first and second seal plates.

74. The method of any of paragraphs 69-73, further comprising:
disposing a second said preform in said chamber, wherein said first seal plate is disposed between and engages each of said preform and said second said preform.

75. The method of paragraph 74, further comprising:
simultaneously exposing a portion of each of said preform and said second said preform to said gaseous medium within each of said plurality of first channels of said first seal plate.

76. The method of any of paragraphs 69-75, further comprising:
introducing said gaseous medium into said plurality of first channels of each of said first and second seal plates through a first end portion of each of said plurality of first channels that extends inwardly beyond said preform.

77. The method of any of paragraphs 69-76, further comprising:
providing an outlet for said gaseous medium between each adjacent pair of said plurality of channels of said first and second seal plates.

78. The method of paragraph 77, wherein said outlet comprises a plurality of second channels that are spaced relative to each of said plurality of first channels.

79. The method of paragraph 78, further comprising:
exiting said gaseous medium from said preform through a second end portion of each of said plurality of second channels that extends outwardly beyond said preform.

DETAILED DESCRIPTION

Figure 1:
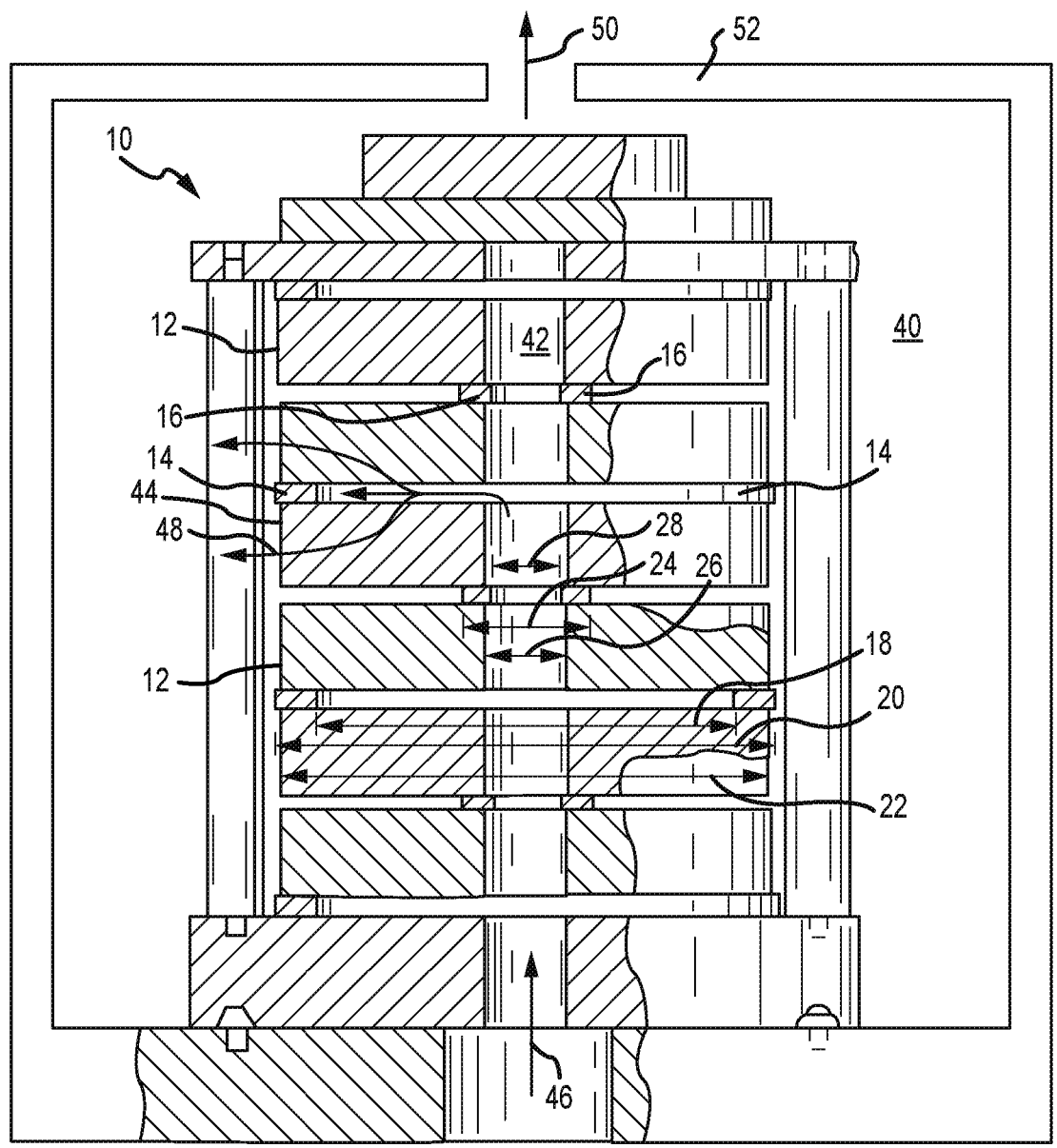
FIG. 1 illustrates a chemical vapor infiltration and deposition vessel for densifying a stack of porous preforms, and that utilizes inner and outer seal plates.

Referring to FIG. 1, an exemplary fixture 10 in a chemical vapor infiltration (CVI) vessel is shown for pressure gradient CVI in a stack of porous structures 12, in accordance with various embodiments. Porous structures 12 may have "OD" (outside diameter) seal plates 14 disposed around the outside diameter of porous structures 12. Porous structures 12 may also have "ID" (inside diameter) seal plates 16 disposed around the inside diameter of porous structures 12. The OD seal plates 14 may have an inside diameter 18 slightly less than the porous structure outside diameter 22, and an outside diameter 20 that may be generally coterminous with the porous structure outside diameter 44. The ID seal plates 16 may have an outside diameter 24 slightly greater than the porous structure inside diameter 26, and an inside diameter 28 that may be generally coterminous with the porous structure inside diameter 26. With ID seal plates 16, the porous structure outside diameter 22 may be greater than the outside diameter 24 of the ring like ID seal plate 16. Seal plate 14 and seal plate 16 may be disposed between porous structures 12 to provide spacing.

In various embodiments, seal plates 14 and seal plates 16 may provide sealing between external volume 40 and internal volume 42. A pressure gradient may be maintained between external volume 40 and internal volume 42 to encourage gas 46 to travel from internal volume 42 through porous structures 12. Gas 48 moves through porous structures 12 from internal volume 42 to external volume 40 and exits from vessel 52 through a port 50. As gas 48 moves through porous structures 12, gas deposits may densify porous structures 12.

The porous structure 12 may comprise at least one of carbon, silicon carbide, silicon nitride, boron carbide, aluminum nitride, titanium nitride, boron nitride, zirconia, $SiC_xN_y$ (wherein x is a number in the range from about zero to about 1, and y is a number in the range from about zero to about 4/3), silica, alumina, titania ($TiO_2$), and a combination of at least two of the foregoing. Prior to densification, the porous structure may be referred to as a preform. A preform for use in making a carbon/carbon composite, such as a carbon/carbon disk brake, may be referred to as a carbonized preform.

A porous structure may comprise any porous structure derived from a fibrous material such as carbon fibers, silicon carbide fibers, and the like. The carbon fibers may be derived from polyacrylonitrile, rayon (synthetic fiber derived from cellulose), pitch, and the like. The fibrous material may be in the form of a woven, braided or knitted fabric or a needled felt. The fibrous material may be in the form of chopped carbon fibers molded to form a preform. Prior to the densification process, the fibrous material may be formed into a preform having any desired shape or form.

The porous structure may be in the form of a disk having any shape such as, for example, a polygon, a cylinder, a triangle, square, rectangle, pentagon, hexagon, octagon, and the like. In addition, the porous structure may have an irregular form.

Figure 2:
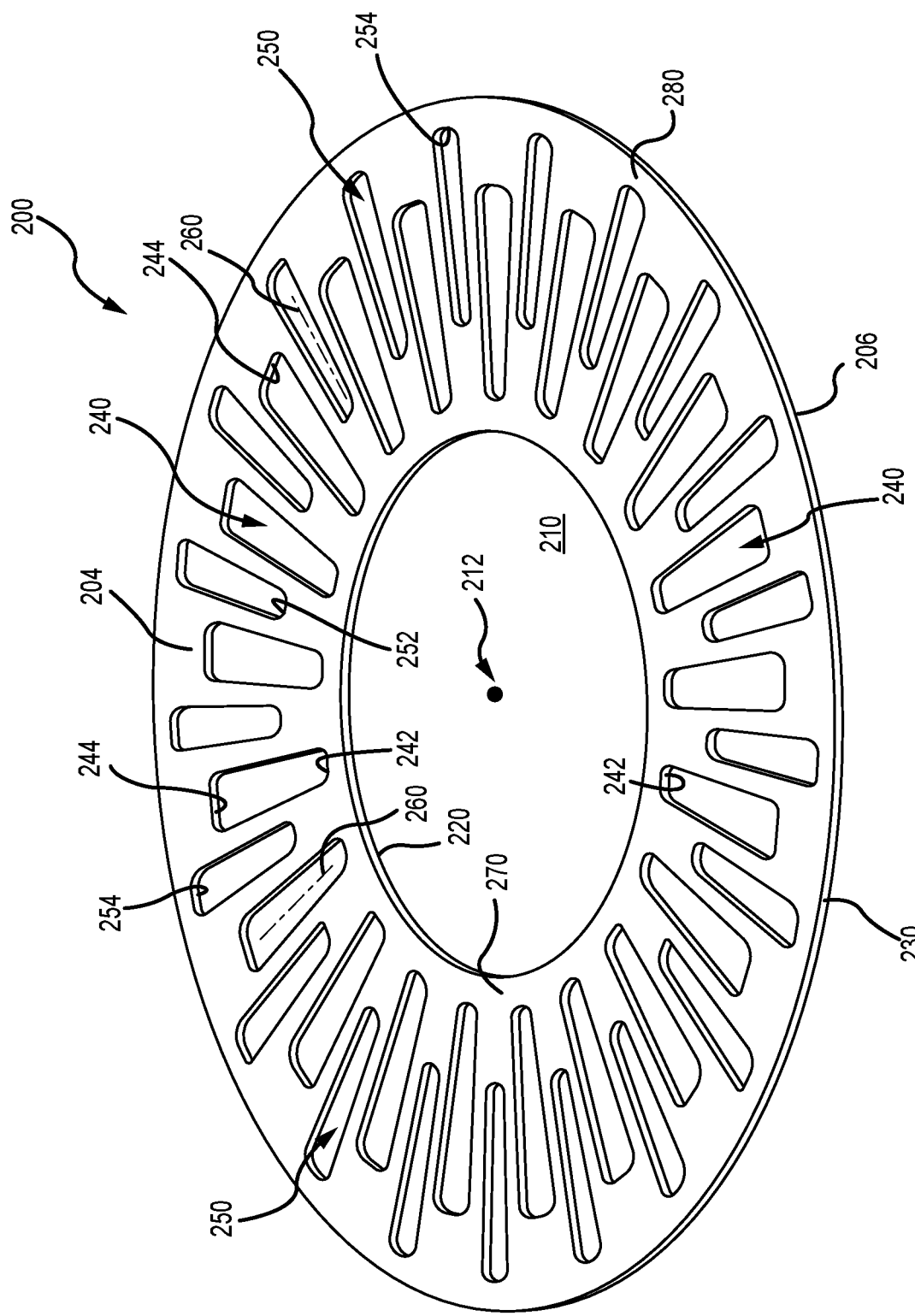
FIG. 2 is a perspective view of a seal plate that may disposed between each adjacent pair of preforms in the chemical vapor and deposition infiltration vessel of FIG. 1.

A seal plate in accordance with various embodiments is illustrated in FIG. 2 and is identified by reference numeral 200. Generally, this seal plate 200 may be disposed between an adjacent pair of porous structures 12 or preforms within the chemical vapor infiltration and deposition vessel 52 shown in FIG. 1. The seal plate 200 may be in the form of a body formed from any appropriate material or combination of materials (e.g., Carbon/Carbon Composite). A plurality of fibers of any appropriate type (e.g., carbon, SiC) may be distributed throughout the body of the seal plate 200.

The seal plate 200 includes an upper surface 204 and an oppositely disposed lower surface 206 that are spaced from one another to define a thickness for the seal plate 200. An opening 210 extends completely through an interior portion of the seal plate 200 to define an inner perimeter 220. Stated another way, the inner perimeter 220 may be characterized as defining a boundary for the opening 210. This opening 210 may define a corresponding portion of the above-noted internal volume 42 when incorporated by the chemical vapor infiltration and deposition vessel of FIG. 1.

An outer perimeter 230 of the seal plate 200 is disposed outwardly of the inner perimeter 220. The inner perimeter 220 and outer perimeter 230 may be circular, may be concentrically disposed relative to a center 212 of the seal plate 200, or both.

A plurality of first channels 240 extend completely through the thickness of the seal plate 200 (e.g., each first channel 240 extends from the upper surface 204 of the seal plate 200 to the lower surface 206 of the seal plate 200) and are disposed in spaced relation to one another. Each first channel 240 may be characterized as including a first end 242 and a second end 244. The spacing between the first end 242 and the second end 244 of each first channel 240 may be characterized as coinciding with a length dimension of the corresponding first channel 240. In various embodiments, a centerline 260 that extends between the first end 242 and the second end 244 of each first channel 240 is disposed along a radius extending from the center 212.

The first end 242 of each first channel 240 is spaced outwardly of the inner perimeter 220, and as such may be characterized as being located between the inner perimeter 220 and its corresponding second end 244. Each first end 242 may be characterized as being positioned closer to the inner perimeter 220 that its corresponding second end 244. The second end 244 of each first channel 240 is spaced inwardly of the outer perimeter 230, and as such may be characterized as being located between the outer perimeter 230 and its corresponding first end 242. Each second end 244 may be characterized as being positioned closer to the outer perimeter 230 that its corresponding first end 242.

In various embodiments, each first channel 240 is wider at its corresponding second end 244 compared to its corresponding first end 242 (e.g., the width dimension being orthogonal to the noted length dimension of the first channel 240). In various embodiments, the width of each first channel 240 progressively increases proceeding from its corresponding first end 242 to its corresponding second end 244. This increase in width regarding the first channels 240 may be continuous, may be at a constant rate, or both, proceeding along the length dimension of the corresponding first channel 240. A minimum width of each first channel 240 at its corresponding first end 242 is about 0.25" (6.35 mm) in various embodiments, and is within a range from about 0.5" (12.7 mm) to about 2.0" (50.8 mm) in various embodiments.

The various first channels 240 may be disposed in equally-spaced relation to one another (e.g., the first channels 240 may be symmetrically disposed relative to/about the center 212 of the seal plate 200). A common spacing may be used between the inner perimeter 220 and the first end 242 of each first channel 240. A common spacing may be used between the outer perimeter 230 and the second end 244 of each first channel 240.

A plurality of second channels 250 extend completely through the thickness of the seal plate 200 (e.g., each second channel 250 extends from the upper surface 204 of the seal plate 200 to the lower surface 206 of the seal plate 200) and are disposed in spaced relation to one another. The plurality of first channels 240 may be characterized as being different in one or more respects than the plurality of second channels 250. At least one second channel 250 is disposed between each adjacent pair of first channels 240 in various embodiments (e.g., a single second channel 240 in FIG. 2).

Each second channel 250 may be characterized as including a first end 252 and a second end 254. The spacing between the first end 252 and the second end 254 of each second channel 250 may be characterized as coinciding with a length dimension of the corresponding second channel 250. In various embodiments, a centerline 260 that extends between the first end 252 and the second end 254 of each second channel 250 is disposed along a radius emanating from the center 212.

The first end 252 of each second channel 250 is spaced outwardly of the inner perimeter 220, and as such may be characterized as being located between the inner perimeter 220 and its corresponding second end 254. Each first end 252 may be characterized as being positioned closer to the inner perimeter 220 that its corresponding second end 254. The second end 254 of each second channel 250 is spaced inwardly of the outer perimeter 230, and as such may be characterized as being located between the outer perimeter 230 and its corresponding first end 252. Each second end 254 may be characterized as being positioned closer to the outer perimeter 230 that its corresponding first end 252.

In various embodiments, each second channel 250 is wider at its corresponding second end 254 compared to its corresponding first end 252 (e.g., the width dimension being orthogonal to the noted length dimension of the second channel 250). In various embodiments, the width of each second channel 250 progressively increases proceeding from its corresponding first end 252 to its corresponding second end 254. This increase in width regarding the second channels 250 may be continuous, may be at a constant rate, or both, proceeding along the length dimension of the corresponding second channel 250. A minimum width of each second channel 250 at its corresponding first end 252 is about 0.25" (6.35 mm) in various embodiments, and is within a range from about 0.5" (12.7 mm) to about 1" (25.4 mm) in various embodiments.

The various second channels 250 may be disposed in equally-spaced relation to one another (e.g., the second channels 250 may be symmetrically disposed relative to/about the center 212 of the seal plate 200). A common spacing may be used between the inner perimeter 220 and the first end 252 of each second channel 250. A common spacing may be used between the outer perimeter 230 and the second end 254 of each second channel 250.

The first end 242 of each first channel 240 may be closer to the inner perimeter 220 than the first end 252 of each second channel 250. The second end 254 of each second channel 250 may be closer to the outer perimeter 230 than the second end 244 of each first channel 240. The width of each first channel 240 at its first end 242 may be greater than the width of each second channel 250 at its corresponding first end 252. The width of each first channel 240 at its second end 244 may be greater than the width of each second channel 250 at its corresponding second end 254.

The seal plate 200 includes an inner annulus 270 and an outer annulus 280 that are spaced from one another (e.g., in a radial dimension or relative to the center 212 of the seal plate 200). Each first channel 240 and each second channel 250 is disposed entirely between the inner annulus 270 and the outer annulus 280 in various embodiments. Stated another way none of the first channels 240, nor none of the second channels 250, extend into either the inner annulus 270 or the outer annulus 280 in various embodiments. The inner annulus 270 and the outer annulus 280 contribute to/enhance the structural integrity of the seal plate 200.

The inner annulus 270 and the outer annulus 280 may be concentrically disposed relative to one another. One characterization is that the inner annulus 270 extends from the inner perimeter 220 to the location corresponding with first end 242 of each of the plurality of first channels 240. Another characterization is that the outer annulus 280 extends from the outer perimeter 230 to the location corresponding with the second end 254 of each of the plurality of second channels 250. A minimum width of the inner annulus 270 is about 0.25" (6.35 mm) in one more embodiments (e.g., measured along a radius emanating from the center 212 of the seal plate 200). A minimum width of the outer annulus 280 is about 0.25" (6.35 mm) in one more embodiments (e.g., measured along a radius emanating from the center 212 of the seal plate 200). In various embodiments, the thickness of the seal plate 200 is no more than about 0.5" (12.7 mm).

Figure 3:
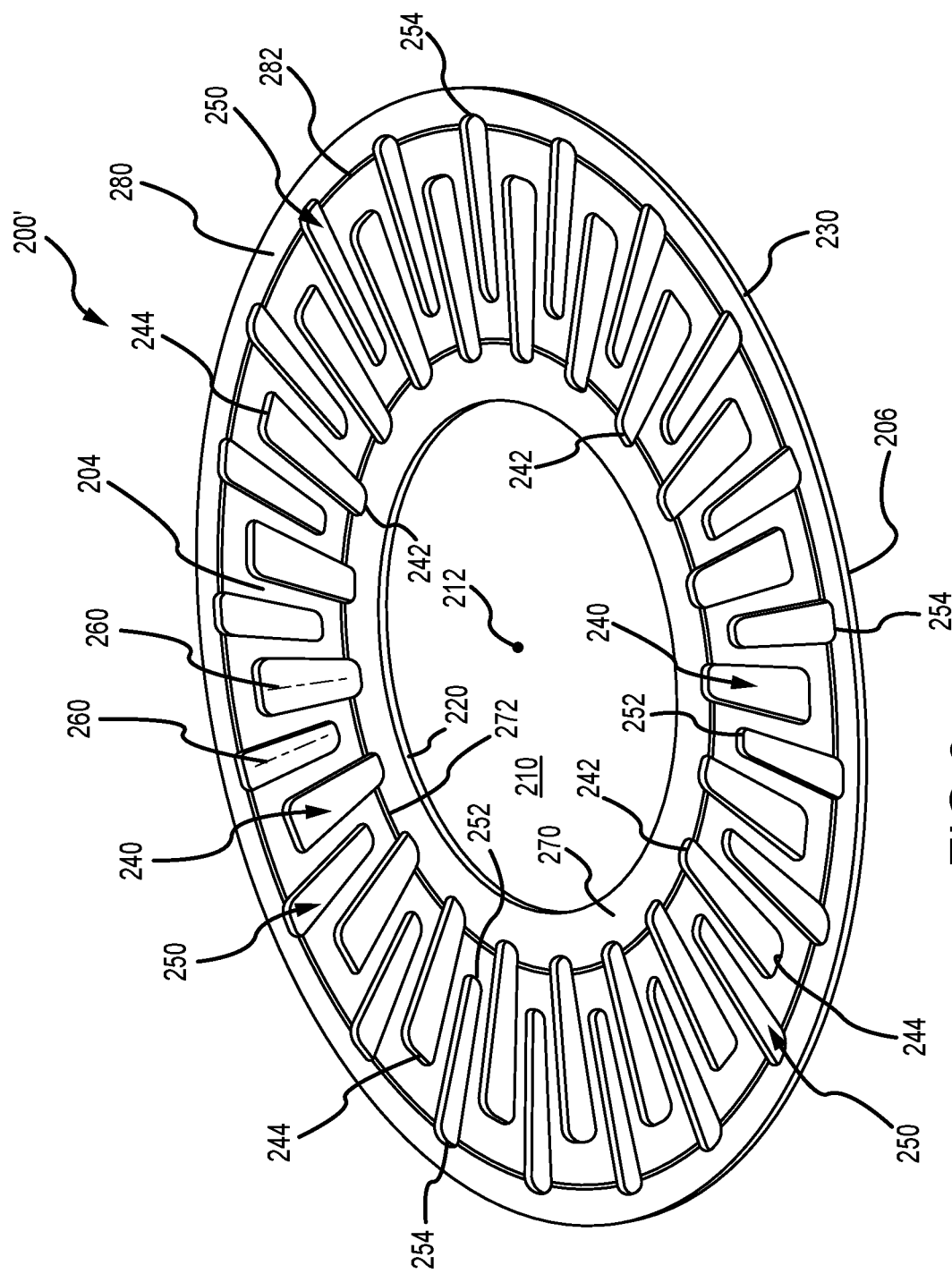
FIG. 3 is a perspective view of a seal plate that may disposed between each adjacent pair of preforms in the chemical vapor and deposition infiltration vessel of FIG. 1, and that incorporates preform alignment features.

A variation of the seal plate 200 of FIG. 2 is presented in FIG. 3 and is identified by reference numeral 200'. Corresponding components between the seal plate of FIG. 2 and the seal plate 200' of FIG. 3 are identified by the same reference numerals, and the discussion presented above remains equally applicable unless otherwise noted to the contrary. The seal plate 200' includes a plurality of inner alignment grooves 272 and a plurality of outer alignment grooves 282 that are each formed on the upper surface 204 of the seal plate 200' (although such alignments grooves 272, 282 could be formed on both the upper surface 204 and the lower surface 206 of the seal plate 200'). The inner alignment grooves 272 may be characterized as being collectively concentrically disposed relative to the outer alignment grooves 282. Each of the alignment grooves 272, 282 may be of any appropriate configuration.

Figure 4:
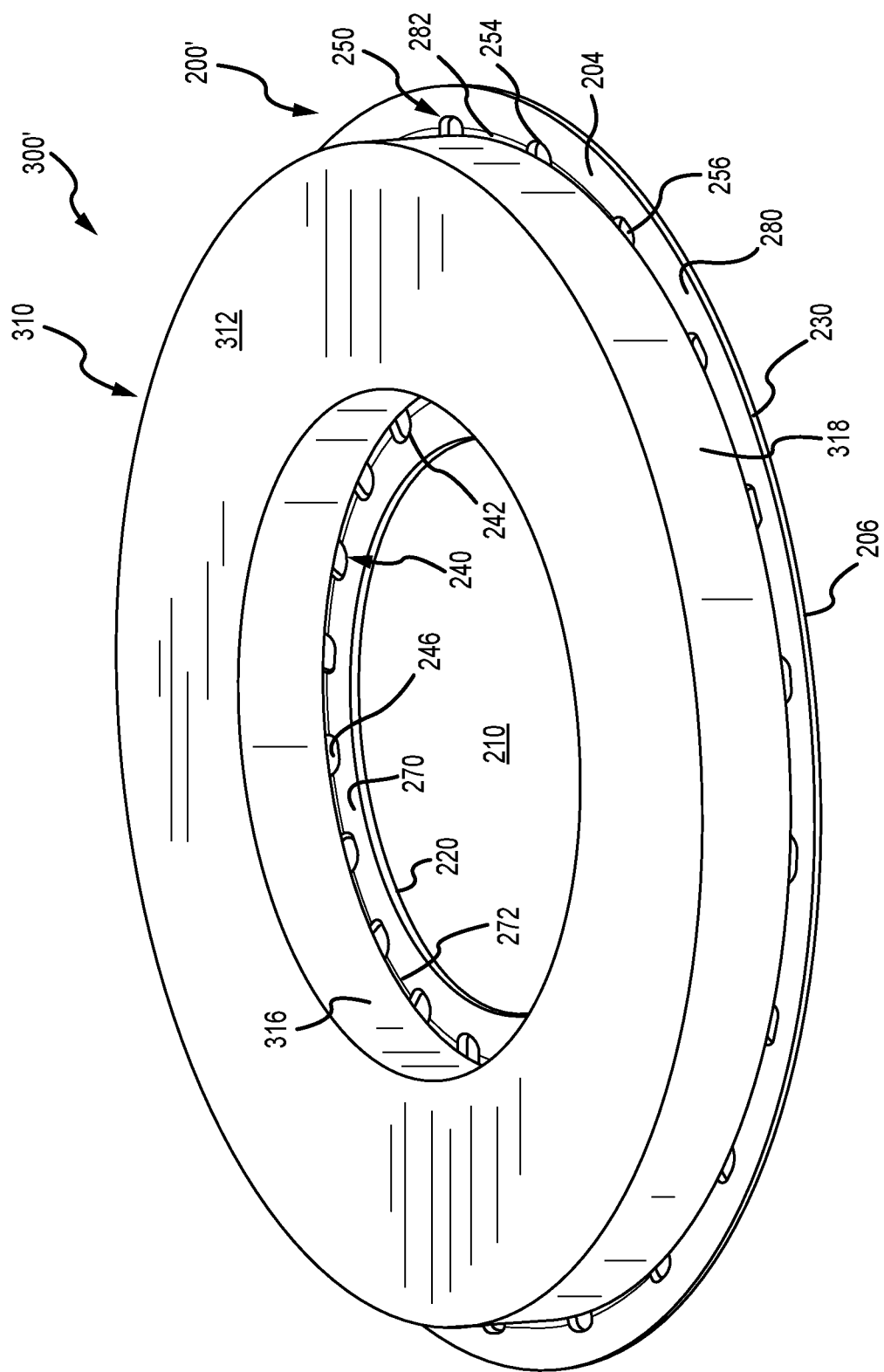
FIG. 4 is a perspective view of the seal plate of FIG. 3, with a preform positioned thereon.

As is shown in FIGS. 3-4, each inner alignment groove 272 intersects an adjacent pair of first channels 240 at a location that is spaced outwardly from the first end 242 of each such first channel 240. Although the inner alignment grooves 272 are illustrated as being continuous proceeding between each adjacent pair of first channels 240, such may not be required in each instance (e.g., the inner alignment groove 272 could be in the form of one or more segments that are spaced from one another proceeding between the corresponding adjacent pair of first channels 240).

As is further shown in FIGS. 3-4, each outer alignment groove 282 intersects an adjacent pair of second channels 250 at a location that is spaced inwardly from the second end 252 of each such second channel 250. Although the outer alignment grooves 282 are illustrated as being continuous proceeding between each adjacent pair of second channels 250, such may not be required in each instance (e.g., the outer alignment groove 282 could be in the form of one or more segments that are spaced from one another proceeding between the corresponding adjacent pair of second channels 250).

The inner alignment grooves 272 and the outer alignment grooves 282 facilitate the positioning of a preform 310 (e.g., in accordance with the porous structure 12 discussed above) on the seal plate 200' and as shown in FIG. 4. The preform 310 may include an upper preform surface 312 and a lower preform surface (that faces the seal plate 200' in the view shown in FIG. 4) that are oppositely disposed and spaced from one another (e.g., to define a thickness of the preform 310). This preform 310 may further include an inner perimeter 316 and an outer perimeter 318 that are spaced from one another (e.g., in a radial dimension). The inner perimeter 316 and outer perimeter 318 may be concentrically disposed in various embodiments.

The combination of the preform 310 and the seal plate 200' may be collectively referred to as a preform stack 300. Another seal plate 200' would typically be positioned on the upper preform surface 312 of the preform 310 in the FIG. 4 arrangement. The preform stack 300 may include any appropriate number of preforms 310, with each adjacent pair of preforms 310 being disposed between and engaged by a pair of seal plates 200'. In any case, the preform stack 300 may be disposed within the chemical vapor infiltration and deposition vessel 52 shown FIG. 1.

Figure 5:
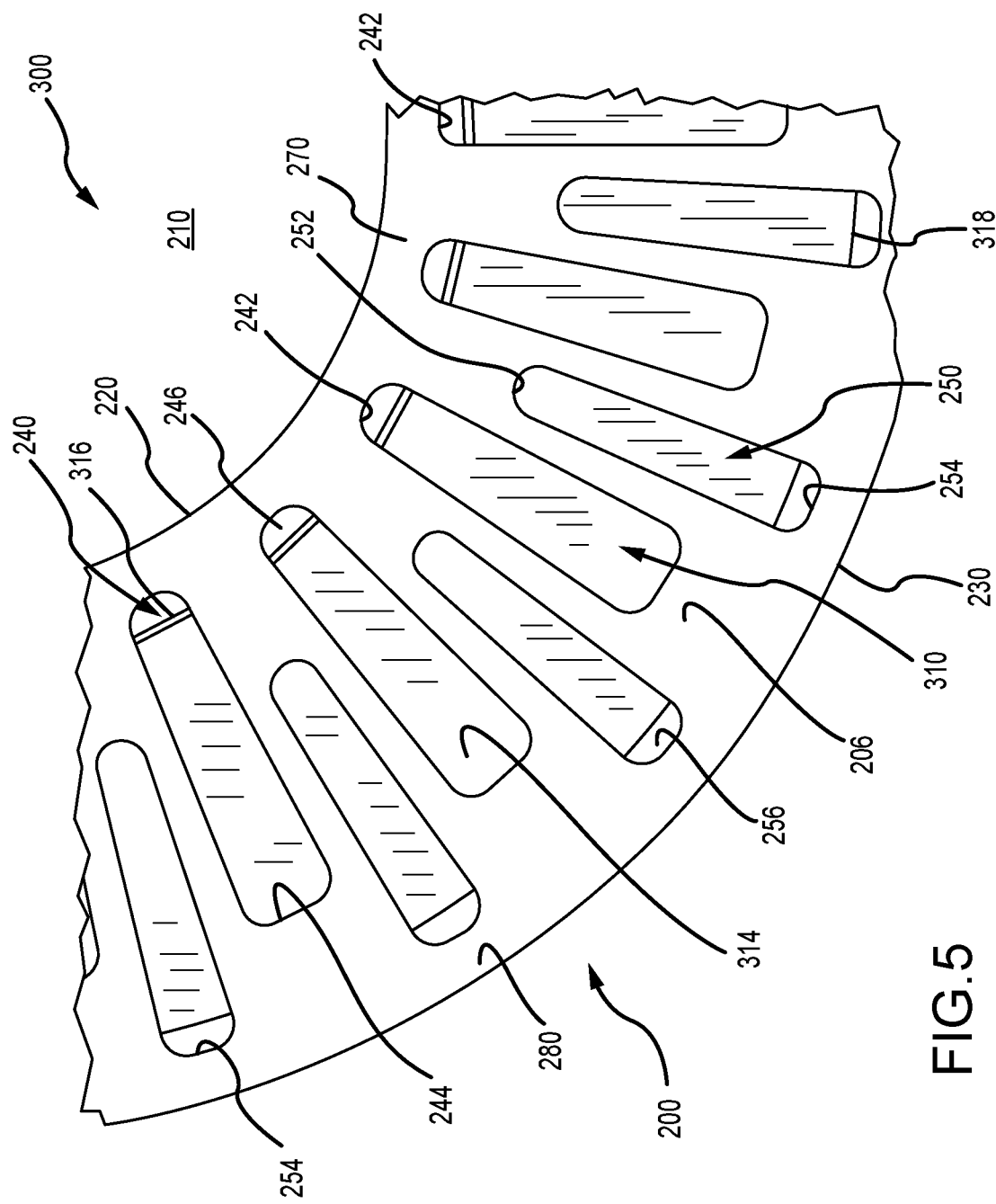
FIG. 5 is a view of a portion of a lower surface of the seal plate of FIG. 2, with a preform being positioned on its upper surface.
Figure 6:
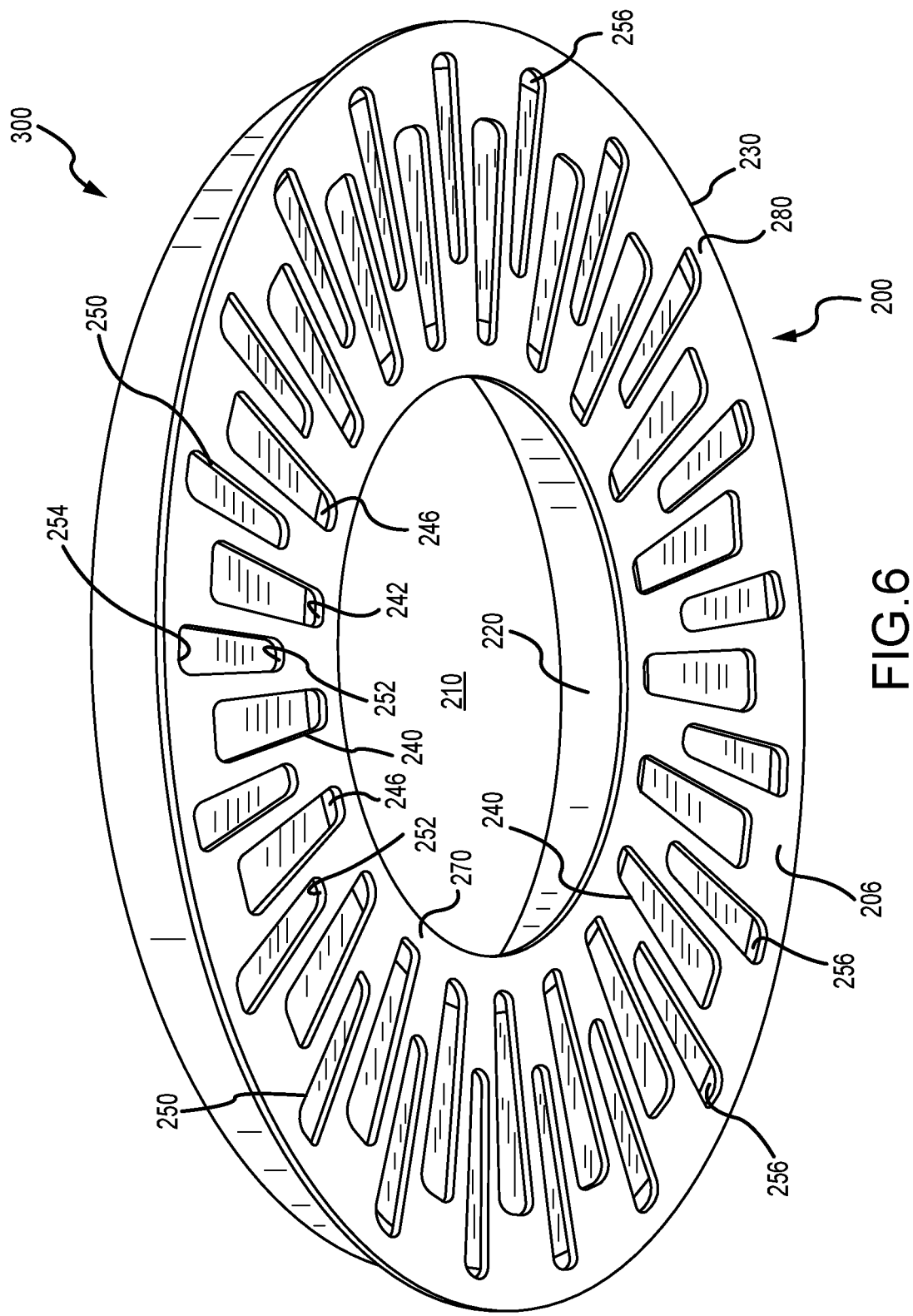
FIG. 6 is a perspective view of a lower surface of the seal plate of FIG. 2, with a preform being positioned on its upper surface.

As shown in FIG. 4, the outer perimeter 318 of the preform 310 is at least generally aligned with the outer alignment grooves 282 of the seal plate 200', while the inner perimeter 316 of the preform 310 is at least generally aligned with the inner alignment grooves 272 of the seal plate 200'. As such, a portion of each second channel 250 of the seal plate 200' extends beyond the outer perimeter 318 of the preform 310 (in the direction of the outer perimeter 230 of the seal plate 200') to define a plurality of outlet ports 256, while a portion of each first channel 240 of the seal plate 200' extends beyond the inner perimeter 316 of the preform 310 (in the direction of the inner perimeter 220 of the seal plate 200') to define a plurality of inlet ports 246. FIGS. 5 and 6 illustrate the existence of the above-noted inlet ports 246 and outlet ports 256 for the case where the preform 310 is positioned on the seal plate 200 of FIG. 2 (where the seal plate 200 does not include the alignment features of the seal plate 200').

A preform stack 300 in accordance with the foregoing may be disposed within the chemical vapor infiltration vessel 52 shown FIG. 1 for simultaneous processing of each preform 310 of the stack 300. As a seal plate 200' will be disposed between each adjacent pair of preforms 310 and engages each of these preforms 310, gas that is within a given first channel 240 will simultaneously access a corresponding surface of both preforms 310 (e.g., an upper side of a given first channel 240 will be closed by one preform 310 (except for the ports 246), while a lower side of the same first channel 240 will be closed by an opposing preform 310 (except for the ports 246). The opening 210 of the various seal plates 200' each define a portion of the internal volume 42 of the chemical vapor infiltration and deposition vessel 52 of FIG. 1 (along with the open space disposed inwardly of the inner perimeter 316 of each preform 310). A pressure gradient may be maintained between the external volume 40 and the internal volume 42 of the chemical vapor infiltration and deposition vessel 52 to encourage gas 46 to travel from internal volume 42 through the various preforms 310. Gas 48 moves through the preforms 310 from internal volume 42 to external volume 40 and exits from vessel 52 through port 50 of the vessel 52. More specifically, gas 48 may enter each of the first channels 240 of the seal plate 200' through the above-noted inlet ports 246 (first channels 240), while gas 48 may exit each of the second channels 250 of the seal plate 200' through the above-noted outlet ports 256 (second channels 250). The profile of at least the plurality of first channels 240 is believed to enhance the distribution of the gas 48 throughout the preforms 310, namely by the progressively increasing width of the first channels 240 proceeding in the direction of their corresponding second ends 244 based upon the higher pressure existing in the internal volume 42 versus the external volume 40. The noted profile of the first channels 240 accounts for there being more reactive gas toward the inner perimeter 220 of the seal plates 200' compared to toward the outer perimeter 230 of the seal plate 200' for purposes of enhancing the distribution of gas 48 throughout the various preforms 310 (e.g., the width of the first channels 240 progressively increases proceeding from the inner perimeter 220 to the outer perimeter 230 of the various seal plates 200' to account for the concentration of the gas 48 decreasing proceeding from the inner perimeter 220 to the outer perimeter 230 of the various seal plates 200'). The seal plate 200 will function similarly to the seal plate 200' except in relation to the alignment provided by the seal plate 200'.

The seal plates 200, 200' provide a number of advantages. One is enhanced mechanical strength or a more robust structure, even when utilizing a thinner profile (e.g., a reduced thickness for the seal plates 200, 200' in accordance with the foregoing). Another is facilitating a more uniform densification of preforms 310 during chemical vapor infiltration and deposition, for instance by providing an increased gas flow through the first channels 240 (from their corresponding first ends 242 to their corresponding second ends 252, and that may correspond with a first direction) based on one or more of the above-described features/characteristics. Although material may be deposited on the sidewalls of the first channels 240, the sizing of the first channels 240 should increase the amount of time between which sidewalls of the first channels 240 will need to be cleaned or re-formed—to remove material that has been deposited on the sidewalls of the first channels 240 during chemical vapor infiltration and deposition. The first channels 240 and second channels 250 may also facilitate removal of the seal plates 200, 200' from the preform 310 due to the reduced contact area between the seal plates 200, 200' and the preform 310 (compared to a continuous flat surface or the like).

The foregoing description has been presented for purposes of illustration and description. Furthermore, the description is not intended to be limited to the form disclosed herein. Consequently, variations and modifications commensurate with the above teachings, and skill and knowledge of the relevant art, are within the scope of the present disclosure. Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Finally, it should be understood that any of the above described concepts can be used alone or in combination with any or all of the other above described concepts. Although various embodiments have been disclosed and described, one of ordinary skill in this art would recognize that certain modifications would come within the scope of this disclosure. Accordingly, the description is not intended to be exhaustive or to limit the principles described or illustrated herein to any precise form. Many modifications and variations are possible in light of the above teaching.

What is claimed:

1. A method of processing a preform, comprising the steps of:
    disposing a preform in a chamber between a first seal plate and a second seal plate that engage opposing surfaces of the preform, wherein each of the first and second seal plates comprises a plurality of first channels that each provide an open space that directly interfaces with one of the opposing surfaces of the preform;
    directing a gaseous medium into the chamber;
    introducing the gaseous medium into each of the plurality of first channels of each of the first and second seal plates through a first end portion of each of the plurality of first channels that extends inwardly beyond the preform;
    increasing a surface area of the preform that is exposed to the gaseous medium within each of the plurality of first channels when proceeding in a first direction along each of the plurality of first channels;
    depositing a material within an interior of the preform using the gaseous medium; and
    exiting the gaseous medium from the preform through a second end portion of each of the plurality of second channels that extends outwardly beyond the preform through an outlet for the gaseous medium disposed between each adjacent pair of the plurality of channels of the first and second seal plates, wherein the outlet comprises a plurality of second channels that are spaced relative to each of the plurality of first channels.

2. The method of any of claim 1, further comprising:
    disposing a second the preform in the chamber, wherein the first seal plate is disposed between and engages each of the preform and the second the preform; and simultaneously exposing a portion of each of the preform and the second the preform to the gaseous medium within each of the plurality of first channels of the first seal plate.

3. The method of claim 1, wherein the preform comprises an inner perimeter and an outer perimeter, and wherein the first direction is toward the outer perimeter of the preform.

4. The method of claim 3, further comprising:
introducing the gaseous medium into an inlet zone of the chamber that is located inwardly of the inner perimeter of the preform.

5. The method of claim 4, wherein the first direction is toward an exit zone that is at a lower pressure than the inlet zone and that is located outwardly of the inlet zone.

6. The method of claim 5, wherein each of the first and second seal plates comprise an interior opening, an outer perimeter, and an inner perimeter that defines a boundary of the interior opening, wherein the inlet zone comprises the interior opening of each of the first and second seal plates.

\* \* \* \* \*